United States Patent
Tortorelli et al.

(10) Patent No.: US 11,798,620 B2
(45) Date of Patent: Oct. 24, 2023

(54) APPARATUSES INCLUDING MULTI-LEVEL MEMORY CELLS AND METHODS OF OPERATION OF SAME

(71) Applicant: Micron Technology, Inc., Boise, ID (US)

(72) Inventors: Innocenzo Tortorelli, Cernusco Sul Naviglio (IT); Russell L. Meyer, Boise, ID (US); Agostino Pirovano, Milan (IT); Andrea Redaelli, Casatenovo (IT); Lorenzo Fratin, Buccinasco (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/816,612

(22) Filed: Aug. 1, 2022

(65) Prior Publication Data

US 2022/0366974 A1    Nov. 17, 2022

Related U.S. Application Data

(63) Continuation of application No. 16/436,734, filed on Jun. 10, 2019, now Pat. No. 11,482,280, which is a
(Continued)

(51) Int. Cl.
*G11C 11/34* (2006.01)
*G11C 11/56* (2006.01)
*G11C 13/00* (2006.01)

(52) U.S. Cl.
CPC ...... *G11C 11/5678* (2013.01); *G11C 13/0004* (2013.01); *G11C 13/004* (2013.01);
(Continued)

(58) Field of Classification Search
CPC ......... G11C 16/01; G11C 16/12; G11C 16/30; G11C 16/0483; H01L 27/115
(Continued)

(56) References Cited

U.S. PATENT DOCUMENTS

| | | |
|---|---|---|
| 4,063,224 A | 12/1977 | Kirschner |
| 7,106,625 B2 | 9/2006 | Yeh |

(Continued)

FOREIGN PATENT DOCUMENTS

| | | |
|---|---|---|
| CN | 1620699 A | 5/2005 |
| CN | 1628357 A | 6/2005 |

(Continued)

OTHER PUBLICATIONS

Second KR Office Action dated Jun. 10, 2022 for KR Appl. No. 10-2021-7029780.
(Continued)

*Primary Examiner* — Son T Dinh
(74) *Attorney, Agent, or Firm* — Dorsey & Whitney LLP

(57) ABSTRACT

Disclosed herein is a memory cell including a memory element and a selector device. Data may be stored in both the memory element and selector device. The memory cell may be programmed by applying write pulses having different polarities and magnitudes. Different polarities of the write pulses may program different logic states into the selector device. Different magnitudes of the write pulses may program different logic states into the memory element. The memory cell may be read by read pulses all having the same polarity. The logic state of the memory cell may be detected by observing different threshold voltages when the read pulses are applied. The different threshold voltages may be responsive to the different polarities and magnitudes of the write pulses.

15 Claims, 11 Drawing Sheets

Related U.S. Application Data continuation of application No. 15/231,518, filed on Aug. 8, 2016, now Pat. No. 10,446,226.

(52) U.S. Cl.
CPC ...... *G11C 13/0061* (2013.01); *G11C 13/0069* (2013.01); *G11C 2013/005* (2013.01); *G11C 2013/0052* (2013.01); *G11C 2013/0073* (2013.01); *G11C 2013/0092* (2013.01); *G11C 2213/71* (2013.01); *G11C 2213/76* (2013.01)

(58) Field of Classification Search
USPC ........................................ 365/185.18, 185.19
See application file for complete search history.

(56) References Cited

U.S. PATENT DOCUMENTS

| | | | |
|---|---|---|---|
| 7,200,045 B2 | 4/2007 | Lue | |
| 7,289,359 B2 | 10/2007 | Kuo et al. | |
| 7,295,407 B2 | 11/2007 | Yuasa et al. | |
| 7,324,377 B2 | 1/2008 | Lee | |
| 7,394,680 B2 | 7/2008 | Toda et al. | |
| 7,515,461 B2 | 4/2009 | Happ et al. | |
| 8,077,505 B2 | 12/2011 | Chen et al. | |
| 8,111,541 B2 | 2/2012 | Lai et al. | |
| 8,299,571 B2 | 10/2012 | Ozawa et al. | |
| 8,450,713 B2 | 5/2013 | Awaya et al. | |
| 8,729,523 B2 | 5/2014 | Pio | |
| 8,829,646 B2 | 9/2014 | Lung et al. | |
| 8,841,649 B2 | 9/2014 | Pio | |
| 9,019,754 B1 | 4/2015 | Bedeschi | |
| 9,105,838 B2 | 8/2015 | Haimoto et al. | |
| 9,728,584 B2 | 8/2017 | Ramaswamy et al. | |
| 9,799,381 B1 | 10/2017 | Tortorelli et al. | |
| 9,805,794 B1 | 10/2017 | Li et al. | |
| 9,978,810 B2 | 5/2018 | Pellizzer | |
| 10,134,470 B2 | 11/2018 | Tortorelli et al. | |
| 10,157,670 B2 | 12/2018 | Pirovano et al. | |
| 10,163,506 B2 | 12/2018 | Pirovano et al. | |
| 10,418,102 B2 | 9/2019 | Tortorelli et al. | |
| 10,446,226 B2 | 10/2019 | Tortorelli et al. | |
| 10,600,481 B2 | 3/2020 | Pirovano et al. | |
| 10,629,651 B2 | 4/2020 | Pellizzer | |
| 10,734,446 B2 | 8/2020 | Pellizzer | |
| 11,018,190 B2 | 5/2021 | Pellizzer | |
| 11,074,971 B2 | 7/2021 | Tortorelli et al. | |
| 11,482,280 B2 | 10/2022 | Tortorelli et al. | |
| 11,615,844 B2 | 3/2023 | Tortorelli et al. | |
| 2004/0042259 A1 | 3/2004 | Campbell et al. | |
| 2004/0062071 A1 | 4/2004 | Rodriguez et al. | |
| 2005/0041467 A1 | 2/2005 | Chen | |
| 2005/0057997 A1 | 3/2005 | Mitani et al. | |
| 2006/0203542 A1 | 9/2006 | Kurotsuchi et al. | |
| 2006/0233019 A1 | 10/2006 | Kostylev et al. | |
| 2007/0008786 A1 | 1/2007 | Scheuerlein | |
| 2007/0047300 A1 | 3/2007 | Lee et al. | |
| 2007/0189065 A1 | 8/2007 | Suh et al. | |
| 2008/0025089 A1 | 1/2008 | Scheuerlein et al. | |
| 2008/0112211 A1 | 5/2008 | Toda | |
| 2008/0205147 A1 | 8/2008 | Santin et al. | |
| 2008/0212363 A1 | 9/2008 | Fuji | |
| 2009/0020745 A1 | 1/2009 | Jeong et al. | |
| 2009/0034325 A1 | 2/2009 | Lowrey et al. | |
| 2009/0040813 A1 | 2/2009 | Kang et al. | |
| 2009/0052231 A1 | 2/2009 | Kurotsuchi et al. | |
| 2009/0052236 A1 | 2/2009 | Bae et al. | |
| 2009/0109737 A1 | 4/2009 | Kostylev | |
| 2009/0116272 A1 | 5/2009 | Kim et al. | |
| 2009/0154222 A1 | 6/2009 | Chien et al. | |
| 2009/0201740 A1 | 8/2009 | Willer et al. | |
| 2009/0279350 A1 | 11/2009 | Chen et al. | |
| 2010/0020606 A1 | 1/2010 | Yamada | |
| 2010/0067291 A1 | 3/2010 | Fuji | |
| 2010/0208508 A1 | 8/2010 | Baek et al. | |
| 2010/0219392 A1 | 9/2010 | Tabuchi et al. | |
| 2010/0226163 A1 | 9/2010 | Savransky | |
| 2010/0284211 A1 | 11/2010 | Hennessey | |
| 2011/0007545 A1 | 1/2011 | Jin et al. | |
| 2011/0294290 A1 | 12/2011 | Nakanishi et al. | |
| 2011/0305075 A1 | 12/2011 | Lowrey et al. | |
| 2011/0316063 A1 | 12/2011 | Tang et al. | |
| 2012/0063245 A1 | 3/2012 | Sonehara | |
| 2012/0168705 A1 | 7/2012 | Liu et al. | |
| 2012/0195100 A1 | 8/2012 | Saitoh et al. | |
| 2012/0327708 A1 | 12/2012 | Du et al. | |
| 2013/0026438 A1 | 1/2013 | Wang et al. | |
| 2013/0044534 A1 | 2/2013 | Kawai et al. | |
| 2013/0044537 A1 | 2/2013 | Ishigaki et al. | |
| 2013/0078776 A1 | 3/2013 | Kim et al. | |
| 2013/0094275 A1 | 4/2013 | Chen | |
| 2013/0135924 A1 | 5/2013 | Pantazi et al. | |
| 2013/0163321 A1 | 6/2013 | Lam et al. | |
| 2013/0200326 A1 | 8/2013 | Ju et al. | |
| 2013/0207065 A1* | 8/2013 | Chiang | H10N 70/826 257/E47.001 |
| 2013/0229846 A1 | 9/2013 | Chien et al. | |
| 2013/0322167 A1 | 12/2013 | Krebs | |
| 2014/0036605 A1 | 2/2014 | Lu et al. | |
| 2014/0043911 A1 | 2/2014 | Samachisa et al. | |
| 2014/0061574 A1 | 3/2014 | Pio | |
| 2014/0061577 A1 | 3/2014 | Kanno et al. | |
| 2014/0063898 A1 | 3/2014 | Fantini et al. | |
| 2014/0077142 A1 | 3/2014 | Choi | |
| 2014/0131653 A1 | 5/2014 | Lee et al. | |
| 2014/0192585 A1 | 7/2014 | Hashim et al. | |
| 2014/0198553 A1 | 7/2014 | Lung | |
| 2014/0217349 A1 | 8/2014 | Hopkins | |
| 2014/0233299 A1 | 8/2014 | Lan et al. | |
| 2014/0268998 A1 | 9/2014 | Jo | |
| 2014/0321194 A1 | 10/2014 | Sonehara | |
| 2014/0321196 A1 | 10/2014 | Ikeda et al. | |
| 2014/0325120 A1 | 10/2014 | Park et al. | |
| 2015/0008387 A1 | 1/2015 | Redaelli et al. | |
| 2015/0044849 A1 | 2/2015 | Pio | |
| 2015/0069635 A1 | 3/2015 | Kim et al. | |
| 2015/0070965 A1 | 3/2015 | Bandyopadhyay et al. | |
| 2015/0074326 A1 | 3/2015 | Castro | |
| 2015/0162080 A1 | 6/2015 | Song | |
| 2015/0187416 A1 | 7/2015 | Bedeschi | |
| 2015/0243336 A1 | 8/2015 | Karpov et al. | |
| 2015/0287460 A1 | 10/2015 | Lee et al. | |
| 2015/0294716 A1 | 10/2015 | Tortorelli et al. | |
| 2015/0311031 A1 | 10/2015 | Platzgummer et al. | |
| 2015/0311256 A1 | 10/2015 | Rabkin et al. | |
| 2015/0380085 A1* | 12/2015 | Park | G11C 11/1675 365/148 |
| 2016/0126455 A1 | 5/2016 | Hayashi et al. | |
| 2016/0133319 A1 | 5/2016 | Fantini et al. | |
| 2016/0225459 A1 | 8/2016 | Boysan et al. | |
| 2016/0240249 A1 | 8/2016 | Kellam et al. | |
| 2016/0336066 A1 | 11/2016 | Lin et al. | |
| 2016/0336378 A1 | 11/2016 | Ohba et al. | |
| 2017/0125097 A1 | 5/2017 | Tortorelli et al. | |
| 2017/0125484 A1 | 5/2017 | Pellizzer et al. | |
| 2017/0330916 A1 | 11/2017 | Hong et al. | |
| 2018/0040370 A1 | 2/2018 | Tortorelli et al. | |
| 2018/0122468 A1 | 5/2018 | Pirovano et al. | |
| 2018/0122472 A1 | 5/2018 | Pirovano et al. | |
| 2018/0138240 A1 | 5/2018 | Pellizzer | |
| 2018/0138241 A1 | 5/2018 | Pellizzer | |
| 2019/0006006 A1 | 1/2019 | Pirovano et al. | |
| 2019/0027218 A1 | 1/2019 | Tortorelli et al. | |
| 2019/0295636 A1 | 9/2019 | Tortorelli et al. | |
| 2019/0325957 A1 | 10/2019 | Tortorelli et al. | |
| 2020/0365659 A1 | 11/2020 | Pellizzer | |
| 2022/0013173 A1 | 1/2022 | Tortorelli et al. | |

FOREIGN PATENT DOCUMENTS

| | | | |
|---|---|---|---|
| CN | 1759482 A | 4/2006 | |
| CN | 1770494 A | 5/2006 | |
| CN | 1977337 A | 6/2007 | |
| CN | 101022120 A | 8/2007 | |

(56) References Cited

FOREIGN PATENT DOCUMENTS

| | | |
|---|---|---|
| CN | 101258600 A | 9/2008 |
| CN | 101354915 A | 1/2009 |
| CN | 101577141 A | 11/2009 |
| CN | 101847647 A | 9/2010 |
| CN | 101978427 A | 2/2011 |
| CN | 102057438 A | 5/2011 |
| CN | 102244195 A | 11/2011 |
| CN | 102473456 A | 5/2012 |
| CN | 103843068 A | 6/2014 |
| CN | 104272394 A | 1/2015 |
| CN | 104641417 A | 5/2015 |
| GB | 201214623 | 10/2012 |
| JP | 2005012186 A | 1/2005 |
| JP | 2005514719 A | 5/2005 |
| JP | 2005076280 A1 | 8/2005 |
| JP | 2005317787 A | 11/2005 |
| JP | 2006514392 A | 4/2006 |
| JP | 2006514393 A | 4/2006 |
| JP | 2006221737 A | 8/2006 |
| JP | 2006324625 A | 11/2006 |
| JP | 2007088626 A | 4/2007 |
| JP | 2007220281 A | 8/2007 |
| JP | 2007324544 A | 12/2007 |
| JP | 2008113010 A | 5/2008 |
| JP | 2008217889 A | 9/2008 |
| JP | 2009054274 A | 3/2009 |
| JP | 2009099198 A | 5/2009 |
| JP | 2009534835 A | 9/2009 |
| JP | 2010092521 A | 4/2010 |
| JP | 2010244607 A | 10/2010 |
| JP | 2010287872 A | 12/2010 |
| JP | 2012064254 A | 3/2012 |
| JP | 2013012285 A | 1/2013 |
| JP | 2013114726 A | 6/2013 |
| JP | 2014216047 A | 11/2014 |
| JP | 6982072 B2 | 11/2021 |
| KR | 20090045653 A | 5/2009 |
| KR | 20090057232 A | 6/2009 |
| KR | 20120073086 A | 7/2012 |
| KR | 20130095959 A | 8/2013 |
| KR | 20140128482 A | 11/2014 |
| KR | 20150046165 A | 4/2015 |
| TW | 201145279 A | 12/2011 |
| TW | 201212318 A | 3/2012 |
| TW | 201515197 A | 4/2015 |
| WO | 2003054887 A1 | 7/2003 |
| WO | 2004084229 A1 | 9/2004 |
| WO | 2005076280 A1 | 8/2005 |
| WO | 2007088626 A1 | 8/2007 |
| WO | 2011087038 A1 | 7/2011 |
| WO | 2011121970 A1 | 10/2011 |
| WO | 2012067737 A1 | 5/2012 |
| WO | 2013059047 A1 | 4/2013 |
| WO | 2013095870 A1 | 6/2013 |
| WO | 2014103577 A1 | 7/2014 |
| WO | 20140176075 A1 | 10/2014 |

OTHER PUBLICATIONS

Second Office Action dated Dec. 8, 2020 for JP Application No. 2019-161800.
Second CN Office Action dated Jul. 30, 2021 for CN Application No. 201680071347.2.
2nd KR Office Action dated Feb. 18, 2022 for KR Application No. 10-2021-7022773.
2nd Office Action dated Jan. 28, 2020 for KR Application No. 10-2018-7015195.
3rd Office Action dated Jun. 4, 2020 for KR Application No. 10-2018-7015195, 3 pgs.
4th Office Action dated Aug. 4, 2020 for KR Application No. 10-2018-7015195.
CN 2nd Office Action dated Mar. 11, 2022 for CN Appl. No. 201680071154.7.
CN Final Office Action dated Apr. 12, 2022 for CN Application No. 201680071347.2.
CN Office Action dated Jul. 27, 2021 for CN Appl. No. 201680071154.7.
EN translation of JP Office Action dated May 18, 2021 for JP Application No. 2019-522220.
EN translation of KR Office Action dated May 18, 2021 for KR Application No. 10-2019-7014867.
English translation of Decision of Rejection for Application No. 2018-522575, dated Apr. 21, 2020.
English translation of first KR Office Action dated Dec. 20, 2021 for KR Appl. No. 10-2021-7029780.
English Translation of First Office Action for Korean Application No. 10-2018-7015196 dated Sep. 2, 2019.
English translation of Notice of Preliminary Rejection, for KR Application No. 10-2019-7014867, dated Jun. 16, 2020.
English Translation of Office Action for TW Application No. 109119186, dated Jan. 27, 2021.
English translation of Office Action for ON Application No. 201680071347.2, dated Jan. 29, 2021.
English translation of Office Action for JP Application No. 2019-522220, dated Aug. 11, 2020.
English translation of Office Action for JP Application No. 2019-522220, dated Feb. 2, 2021.
English translation of Office Action for KR Application No. 10-2019-7014867, dated Mar. 5, 2021.
English Translation of Third Office Action dated Jul. 11, 2019 for Taiwan application No. 106128742.
EP Office Action dated Aug. 18, 2021 for EP Appl. No. 16862719.8.
EP Office Action dated Feb. 23, 2022 for EP Application No. 17864819.2.
EP Office Action dated Jan. 5, 2022 for EP Application No. 17839997.8.
EP Office Action dated Jul. 12, 2021 for EP Application No. 16862692.7.
EP Office Action dated Jul. 3, 2020 for EP Application No. 16862692.7, 4 pgs.
EP Office Action dated Sep. 16, 2020 for EP Application No. 16862719.8.
EP Search Report for Application No. 16862692.7 dated May 24, 2019.
Extended EP Search Report dated Feb. 19, 2020 for EP Application No. 17839997.8, 8 pages.
Extended European Search Report for Application No. 17864819.2, dated May 25, 2020.
First Office Action dated Jul. 24, 2017 for Taiwan Application No. 105135964.
First Office Action dated Jul. 5, 2019 for Korean application No. 10-2018-7015195.
First Office Action dated Mar. 13, 2018 for Taiwanese Application No. 106126746.
First Office Action received for TW Application No. 106128742, dated Jun. 19, 2018.
International Preliminary Report on Patentability dated Feb. 12, 2019 for PCT Application No. PCT/US2017/043245, 12 pages.
International Search Report and Written Opinion dated Nov. 22, 2017 for PCT Application No. PCT/US2017/046585.
International Search Report and Written Opinion dated Oct. 30, 2017 for PCT Application No. PCT/US2017/043245.
IPRP dated May 9, 2019 for PCT application No. PCT/US2017/046585.
JP Office Action dated Jun. 16, 2020 for JP Application No. 2019-506397, 8 pgs.
JP Office Action dated Sep. 28, 2021 for JP Appl. No. 2020-169530.
JP Office Action dated Sep. 8, 2020 for JP Application No. 2019-161800.
KR Office Action dated Jan. 10, 2022 for KR Appl. No. 10-2019-7014867.
KR Office Action dated Jun. 26, 2020 for KR Application No. 10-2019-7005610, 8 pgs.
Notice of Rejection Grounds dated Jul. 9, 2019 for JP Application No. 2018-522575.

(56) References Cited

OTHER PUBLICATIONS

Office Action dated Mar. 26, 2018 for Taiwanese Application No. 105136005.
Office Action dated Mar. 6, 2018 for Taiwanese Application No. 105135964.
Second Office Action dated Feb. 20, 2019 for TW Application No. 106128742.
Third CN Office Action dated Dec. 27, 2021 for CN Application No. 201680071347.2.
Translation of KR Office Action dated Aug. 11, 2021 for KR Appl. No. 10-2021-7022773.
[English Translation] First CN Office Action dated Aug. 3, 2022 for CN Application No. 201780047990.6; pp. all.

\* cited by examiner

APPARATUSES INCLUDING MULTI-LEVEL MEMORY CELLS AND METHODS OF OPERATION OF SAME

CROSS REFERENCE TO RELATED APPLICATION(S)

This application is a continuation of U.S. patent application Ser. No. 16/436,734, filed Jun. 10, 2019, and issued as U.S. Pat. No. 11,482,280 on Oct. 25, 2022, which is a continuation of U.S. patent application Ser. No. 15/231,518 filed Aug. 8, 2016, and issued as U.S. Pat. No. 10,446,226, on Oct. 15, 2019. The aforementioned applications, and issued patents, are incorporated herein by reference, in their entirety, for any purpose.

BACKGROUND

Traditional memory cells include a memory element, which is used to store a logic state, and a selector device. The memory element and selector device may be located at a cross-point of a first access line (e.g., word line) and a second access line (e.g., bit line) in a memory array having a cross-point architecture. The selector may be coupled to the word line and the memory element may be coupled to the bit line in some architectures. The selector device may reduce leakage currents and allow selection of a single memory element for reading data and/or writing data. However, traditional memory cells in cross-point architecture may not allow storage of more than one bit per cell. Storing more than one bit per memory cell may allow greater storage capacity without increasing the area of a memory array.

DETAILED DESCRIPTION

Figure 1A:
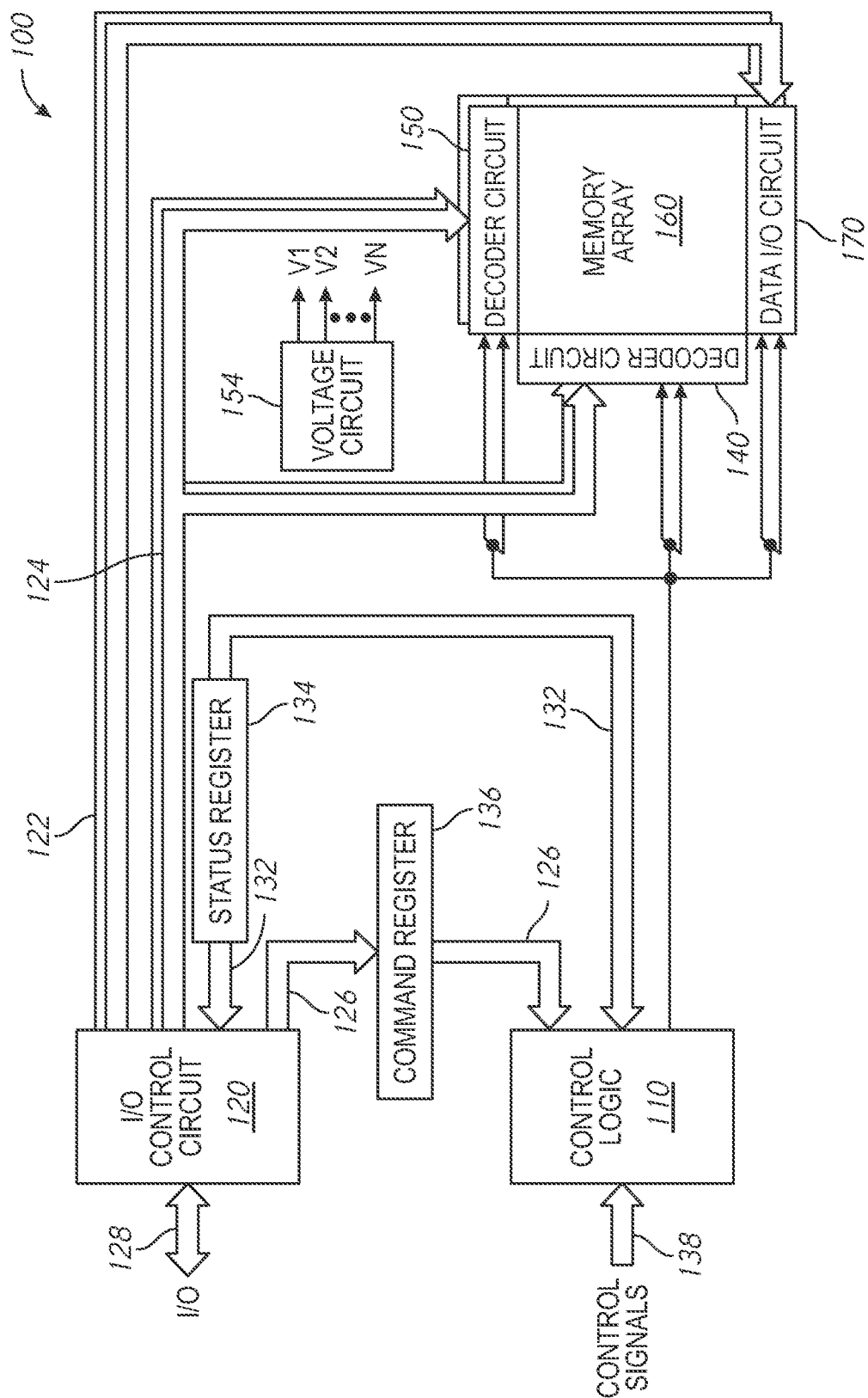
FIG. 1A is a block diagram of a memory according to an embodiment of the disclosure.

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

A memory array may include memory cells that each include a memory element and a selector device. In some embodiments, both the memory element and the selector device of a memory cell are utilized to store data. The utilization of both elements of the memory cell may allow the memory cell to store multiple bits of data. The memory cell capable of storing multiple bits of data may be referred to as a multi-level cell. Multiple bits of data may include a non-integer number of bits (e.g., 1.5, 2.5 bits). The multiple bits of data may correspond to different logic levels (e.g., 00, 01, 10, 11). For example, two bits of data may be stored with four logic levels and 1.5 bits of data may be stored with three logic levels in the memory cell. Other combinations of logic levels and bits may be used. The logic levels may be associated with different threshold voltages (e.g., $V_{TH}$) of the memory cell and/or associated with different threshold voltage properties exhibited by the memory cell. A memory cell may exhibit a threshold voltage property, for example, by having or appearing to have a particular threshold voltage. The memory cell may or may not experience a threshold event when exhibiting the threshold voltage properties.

A memory element may include a phase change material (PCM). When the PCM is in an amorphous state, the PCM may have a high resistance. This may be referred to as a reset state. When the PCM is in a crystalline or semi-crystalline state, the PCM may have a lower resistance than when in the amorphous state. This may be referred to as a set state. In some embodiments, the PCM may have multiple crystalline states that may have distinct resistance levels and correspond to different set states. The crystalline state of the PCM may depend on a magnitude of a voltage and/or current of a write pulse applied across the memory cell. The change of resistance between the states of the PCM may affect a threshold voltage of the PCM. For example, the memory element may exhibit a different threshold voltage based, at least in part, on the crystalline state of the PCM.

A selector device may be a different material than the memory element in some embodiments. In some embodiments, the selector device may be a different PCM, a chalcogenide material, and/or chalcogenide alloy. The threshold voltage exhibited by the selector device may depend on the relative voltage polarities of read and write pulses applied across the memory cell. For example, the selector device may exhibit a first threshold voltage when read if the memory cell was written to and then read with the same voltage polarity. The selector may exhibit a second threshold voltage when read if the memory cell was written to and then read with different (e.g., opposite) voltage polarities.

Threshold voltage properties of the memory element may be based on the magnitude of the voltage and/or current applied to a memory cell, and the threshold voltage properties of the selector device may be based on the voltage polarities applied to the memory cell. The threshold voltage properties of the memory element and selector device may be combined to provide a memory cell that can be programmed to exhibit one of multiple threshold voltages. These multiple threshold voltages may be used to correspond to logic levels that correspond to multiple bits of data (e.g., $V_{TH0}$=11, $V_{TH1}$=10, $V_{TH2}$=01, $V_{TH3}$=00). The multiple logic levels may allow the memory cell to store multiple bits of data. One or more of the multiple bits of data may be stored in different physical locations in the memory cell. In some embodiments, one bit of data is stored in the memory element and one bit of data is stored in the selector device. In some embodiments, for example, when the memory element has multiple crystalline states, multiple bits of data may be stored in the memory element and one bit of data may be stored in the selector device. Other distributions of data between the memory element and the selector device may be used.

A logic state may be written to the memory cell, which may correspond to one or more bits of data. A logic state may be written to the memory cell by applying voltages of different polarities at different voltage and/or current magnitudes. The memory cell may be read by applying voltages of a single polarity. The writing and reading protocols may take advantage of different threshold voltages of the memory element and selector device that result from the different magnitudes and polarities, respectively. The memory cell may require short, relatively low power pulses to read. In some embodiments, the memory element may include a chalcogenide material. In some embodiments, the selector device may include a chalcogenide material. However, the chalcogenide material of the selector device may or may not undergo a phase change during reading and/or writing. In some embodiments, the chalcogenide material may not be a phase change material.

FIG. 1A illustrates an apparatus that includes a memory 100 according to an embodiment of the present invention. The memory 100 includes a memory array 160 with a plurality of memory cells that are configured to store data. The memory cells may be accessed in the array through the use of various access lines, word lines (WLs) and/or bit lines (BLs). The memory cells may be non-volatile memory cells, such as NAND or NOR flash cells, phase change memory cells, or may generally be any type of memory cells. The memory cells of the memory array 160 can be arranged in a memory array architecture. For example, in one embodiment, the memory cells are arranged in a three-dimensional (3D) cross-point architecture. In other embodiments, other memory array architectures may be used, for example, a single-deck cross-point architecture, among others. The memory cells may be single level cells configured to store data for one bit of data. The memory cells may also be multi-level cells configured to store data for more than one bit of data.

An I/O bus 128 is connected to an I/O control circuit 120 that routes data signals, address information signals, and other signals between the I/O bus 128 and an internal data bus 122, an internal address bus 124, and/or an internal command bus 126. An address register (not shown) may be provided address information by the I/O control circuit 120 to be temporarily stored. In some embodiments, the I/O control circuit 120 may include the address register. The I/O control circuit 120 is coupled to a status register 134 through a status register bus 132. Status bits stored by the status register 134 may be provided by the I/O control circuit 120 responsive to a read status command provided to the memory 100. The status bits may have respective values to indicate a status condition of various aspects of the memory and its operation.

The memory 100 also includes a control logic 110 that receives a number of control signals 138 either externally or through the command bus 126 to control the operation of the memory 100. The control signals 138 may be implemented with any appropriate interface protocol. For example, the control signals 138 may be pin based, as is common in dynamic random access memory and flash memory (e.g., NAND flash), or op-code based. Example control signals 138 include clock signals, read/write signals, clock enable signals, etc. A command register 136 is coupled to the internal command bus 126 to store information received by the I/O control circuit 120 and provide the information to the control logic 110. The control logic 110 may further access a status register 134 through the status register bus 132, for example, to update the status bits as status conditions change. The control logic 110 may be configured to provide internal control signals to various circuits of the memory 100. For example, responsive to receiving a memory access command (e.g., read, write), the control logic 110 may provide internal control signals to control various memory access circuits to perform a memory access operation. The various memory access circuits are used during the memory access operation, and may generally include circuits such as decoder circuits, charge pump circuits, access line drivers, data and cache registers, I/O circuits, as well as others.

The address register provides block-row address signals to a decoder circuit 140 and column address signals to a decoder circuit 150. The decoder circuit 140 and decoder circuit 150 may be used to select blocks of memory cells for memory operations, for example, read and write operations. The decoder circuit 140 and/or the decoder circuit 150 may include one or more access line drivers configured to provide signals to one or more of the access lines in the memory array 160 to perform memory operations. For example, read pulses and write pulses may be provided to the access lines for read and write operations. The access line drivers may be coupled to access lines of the memory array 160. The access line drivers may drive the access lines with a voltage that is provided by voltage circuit 154. The voltage circuit 154 may provide different voltages V1, V2, . . . , VN used during operation of the memory 100, for example, during memory access operations. The voltages V1, V2, . . . , VN provided by the voltage circuit 154 may include voltages that are greater than a power supply voltage provided to the memory 100, voltages that are less than a reference voltage (e.g., ground) provided to the memory 100, as well as other voltages.

A data I/O circuit 170 includes one or more circuits configured to facilitate data transfer between the I/O control circuit 120 and the memory array 160 based on signals received from the control logic 110. In various embodiments, the data I/O circuit 170 may include one or more sense amplifiers, registers, buffers, and other circuits for sensing logic states, managing data transfer between the memory array 160 and the I/O control circuit 120. For example, during a write operation, the I/O control circuit 120 receives the data to be written through the I/O bus 128 and provides the data to the data I/O circuit 170 via the internal data bus 122. The data I/O circuit 170 writes the data to the memory array 160 based on control signals provided by the control logic 110 at a location specified by the decoder circuit 140 and the decoder circuit 150. During a read operation, the data I/O circuit reads data from the memory array 160 based on control signals provided by the control logic 110 at an address specified by the decoder circuit 140 and the decoder circuit 150. The data I/O circuit provides the read data to the I/O control circuit via the internal data bus 122. The I/O control circuit 120 then provides the read data on the I/O bus 128.

In some embodiments, the control logic 110 controls circuits (e.g., access line drivers) such that during a write operation on a memory cell of the memory array 160, a first voltage (e.g., 0V) may be provided to a selected word and a second voltage may be provided to a selected bit line. The memory cell may be at the intersection of the selected word line and bit line. The second voltage may be higher or lower than the voltage provided to the word line, based on the logic state to be stored at the address corresponding to the selected word line and bit line. The amplitude of the second voltage may be based on the logic state to be stored at the address corresponding to the selected word line and bit line (e.g., −6V for '00', −4V for '01', +4V for '10', and +6V for '11'). In some embodiments, during a write operation, the selected bit line may always be provided a specific voltage, and the word line may be provided a voltage higher or lower than the voltage of the bit line, based on the logic state to be stored at the address.

In some embodiments, during a read operation on a memory cell, a first voltage (e.g., 0V) may be provided to a selected word line and a second voltage (e.g., −5V, +5V) may be provided to a selected bit line. The memory cell may be at the intersection of the selected word line and bit line. The second voltage may be greater than or less than the first voltage provided to the word line, however, the second voltage may provide the same voltage polarity for every read operation. The logic state of the memory cell may be sensed by a sense amplifier coupled to the selected bit line. The sensed logic state of the memory cell may be provided to the data I/O circuit 170.

Figure 1B:
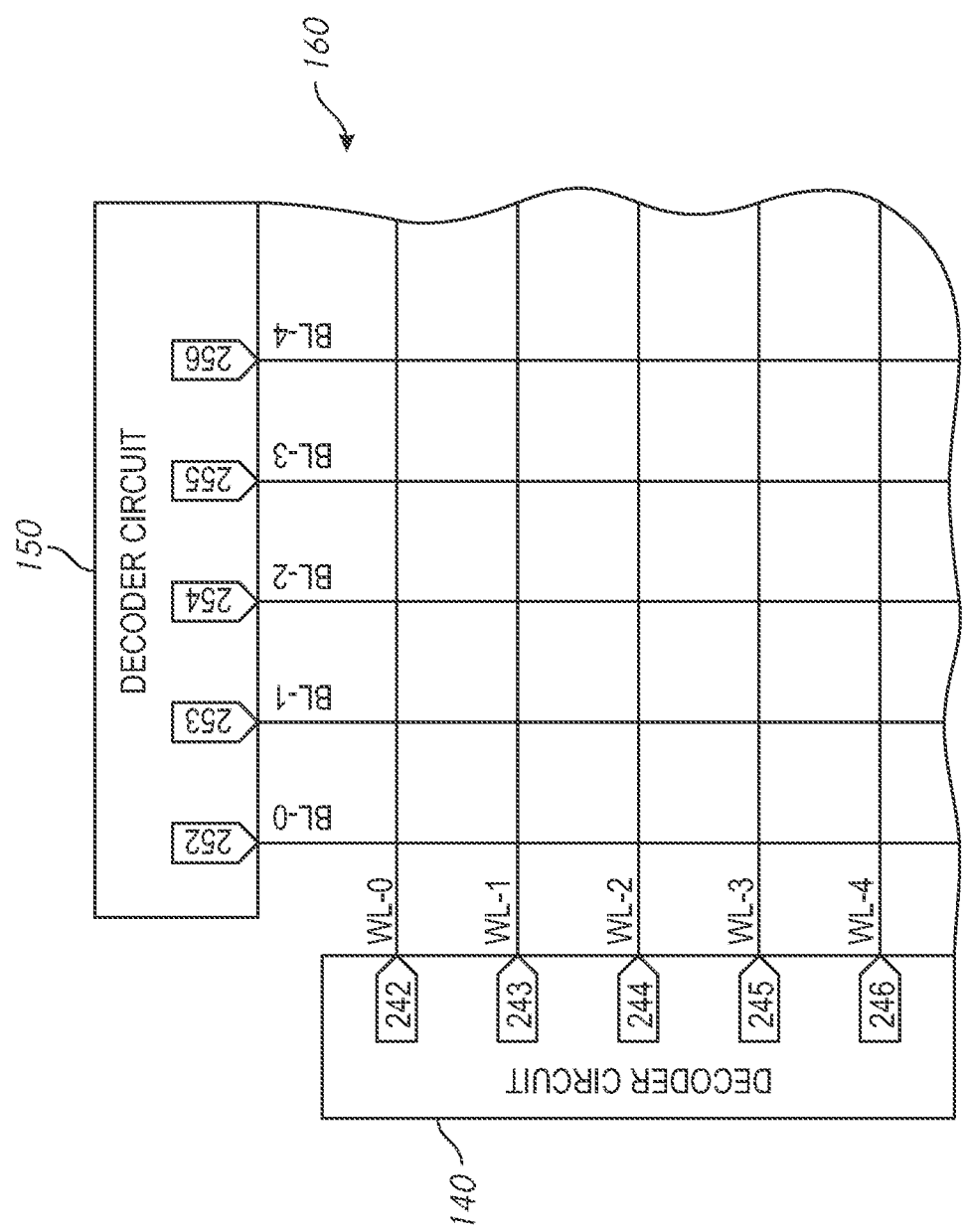
FIG. 1B is a block diagram of a memory array according to an embodiment of the disclosure.

FIG. 1B illustrates a memory array 160 according to an embodiment of the invention. The memory array 160 includes a plurality of access lines, for example, access lines WL-0, WL-1, WL-2, WL-3, WL-4 and access lines BL-0, BL-1, BL-2, BL-3, BL-4. Memory cells (not shown in FIG. 1B) may be at the intersections of the access lines. A plurality of individual or groups of memory cells of the memory array 160 are accessible through the access lines WL-0, WL-1, WL-2, WL-3, WL-4 and access lines BL-0, BL-1, BL-2, BL-3, BL-4. Data may be read from or written to the memory cells. A decoder circuit 140 is coupled to the plurality of access lines WL-0, WL-1, WL-2, WL-3, WL-4, with respective access line drivers 242, 243, 244, 245, 246 biasing each of the respective access lines WL-0, WL-1, WL-2, WL-3, WL-4. A decoder circuit 150 is coupled to the plurality of access lines BL-0, BL-1, BL-2, BL-3, BL-4, with respective access line drivers 252, 253, 254, 255, 256 biasing each of the respective access lines BL-0, BL-1, BL-2, BL-3, BL-4.

Internal control signals are provided, for example, by the control logic 110, to the access line drivers 252, 253, 254, 255, 256 in order to bias the respective access lines BL-0, BL-1, BL-2, BL-3, BL-4. Internal control signals are also provided, for example, also by the control logic 110, to the access line drivers 242, 243, 244, 245, 246 in order to bias the respective word lines WL-0, WL-1, WL-2, WL-3, WL-4. The control logic 110 may be a state machine that, upon receiving commands such as read, write, etc., determines which biasing signals need to be provided to which signal lines at which biasing levels. The biasing signals that need to be provided to the access lines WL-0, WL-1, WL-2, WL-3, WL-4, BL-0, BL-1, BL-2, BL-3, BL-4 may depend on an operation that will be performed responsive to a received command.

Figure 2:
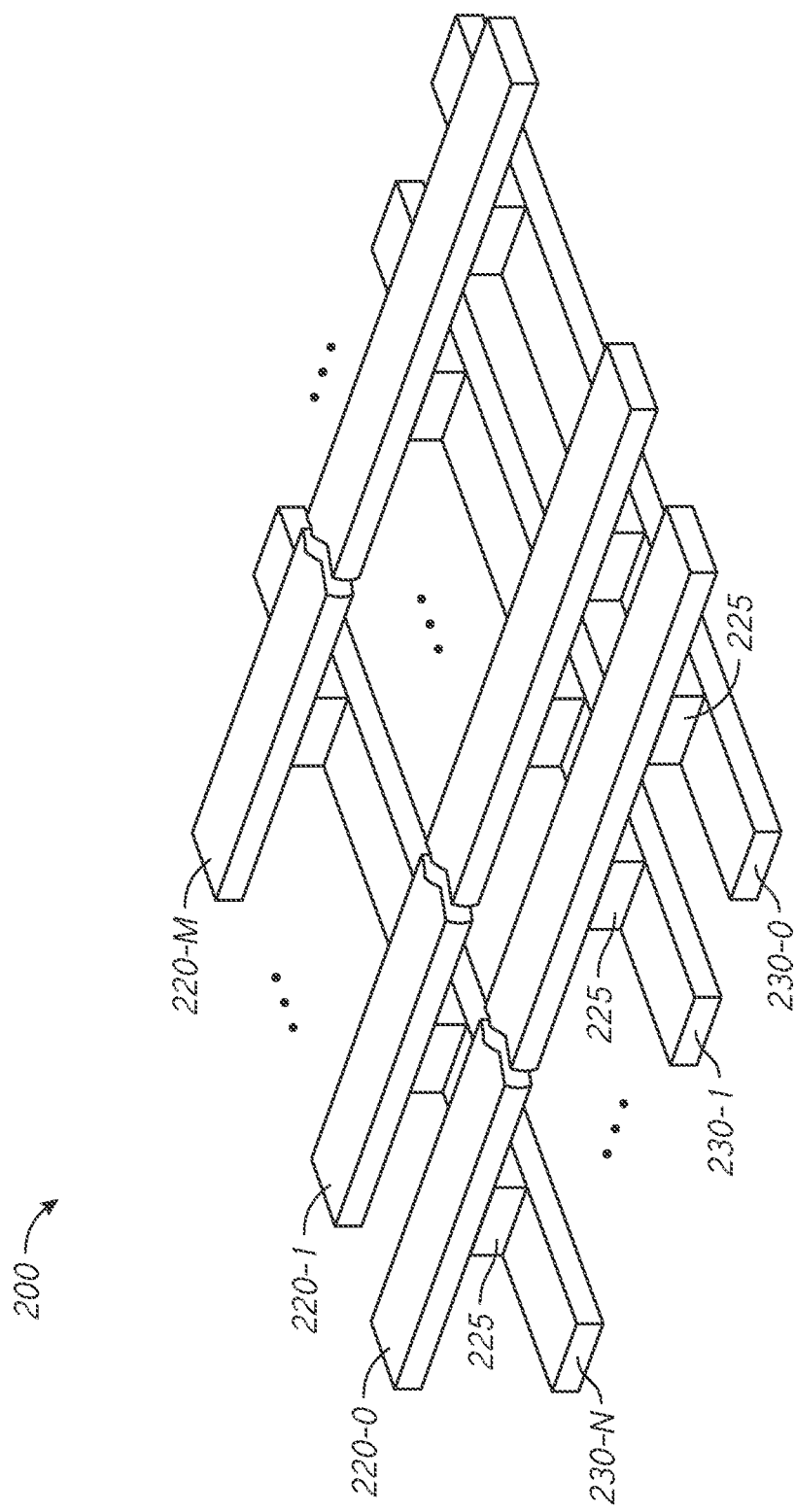
FIG. 2 is a schematic illustration of a portion of a memory array according to an embodiment of the disclosure.

FIG. 2 is a diagram illustrating a portion of an array 200 of memory cells according to an embodiment of the disclosure. The array 200 may be used to implement the memory array 160 of FIG. 1 in some embodiments. In the example illustrated in FIG. 2, the array 200 is a cross-point array including a first number of conductive lines 230-0, 230-1, . . . , 230-N, e.g., access lines, which may be referred to herein as word lines, and a second number of conductive lines 220-0, 220-1, . . . , 220-M, e.g., access lines, which may be referred to herein as bit lines. A memory cell 225 is located at each of the intersections of the word lines 230-0, 230-1, . . . , 230-N and bit lines 220-0, 220-1, . . . , 220-M and the memory cells 225 can function in a two-terminal architecture, e.g., with a particular word line 230-0, 230-1, . . . , 230-N and bit line 220-0, 220-1, . . . , 220-M serving as the electrodes for the memory cells 225.

The memory cells 225 can be resistance variable memory cells, e.g., RRAM cells, CBRAM cells, PCRAM cells, and/or STT-RAM cells, among other types of memory cells. The memory cell 225 can include a material programmable to different data states (e.g., chalcogenide). For example, the memory cell 225 may include a composition that may include selenium (Se), arsenic (As), germanium (Ge), silicon (Si), or combinations thereof. Other materials may also be used. For instance, the memory cell 225 may be written to store particular levels corresponding to particular data states responsive to applied writing voltage and/or current pulses, for instance. Embodiments are not limited to a particular material or materials. For instance, the material can be a chalcogenide formed of various doped or undoped materials. Other examples of materials that can be used to form memory elements or selector devices include binary metal oxide materials, colossal magnetoresistive materials, and/or various polymer based resistance variable materials, among others.

In operation, the memory cells 225 of array 200 can be written to by applying a voltage, e.g., a write voltage, across the memory cells 225 via selected word lines 230-0, 230-1, . . . , 230-N and bit lines 220-0, 220-1, . . . , 220-M. A sensing, e.g., read, operation can be used to determine the data state of a memory cell 225 by sensing current, for example, on a bit line 220-0, 220-1, . . . , 220-M corresponding to the respective memory cell responsive to a particular voltage applied to the selected word line 230-0, 230-1, . . . , 230-N to which the respective cell is coupled.

Figure 3:
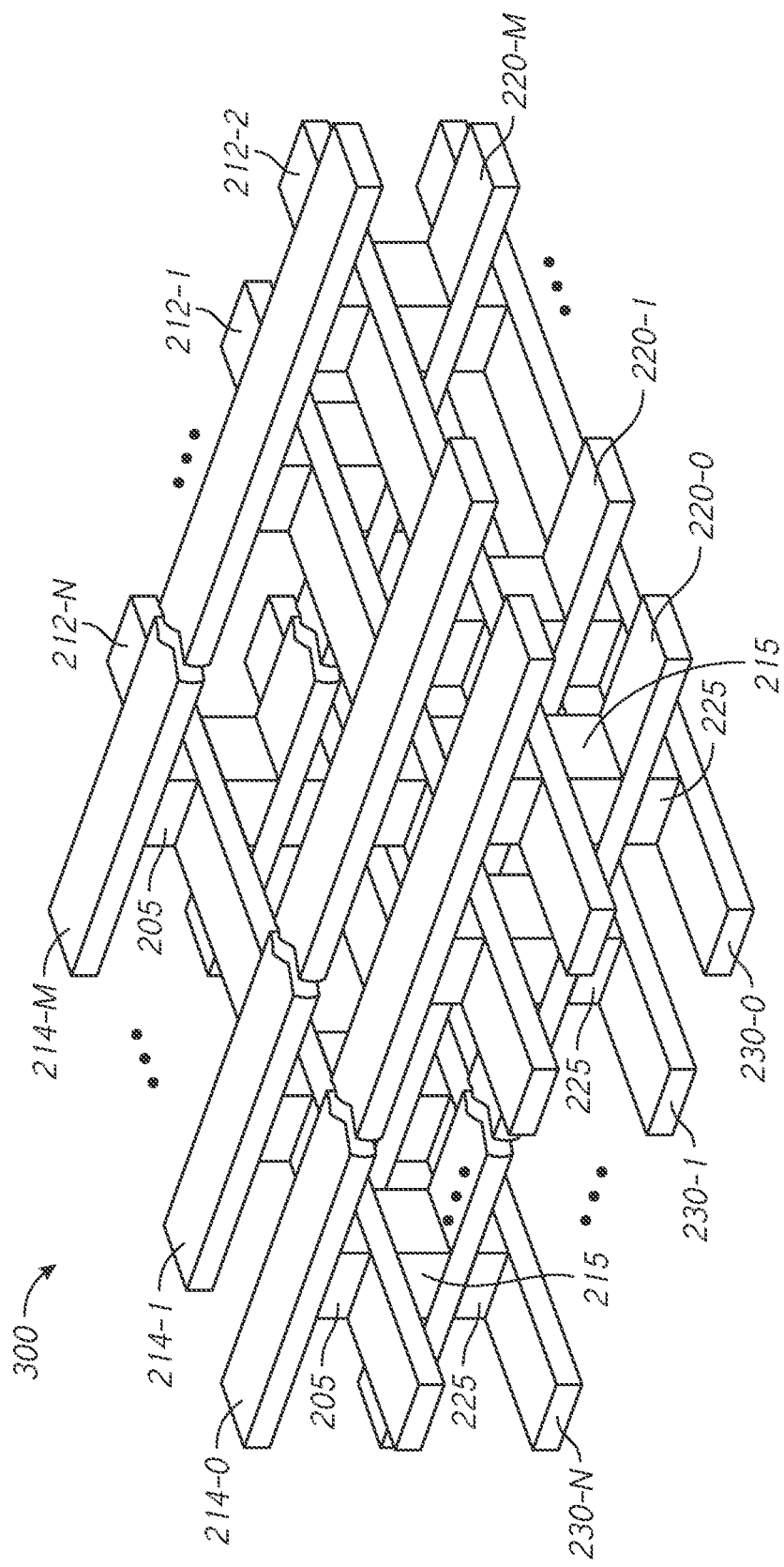
FIG. 3 is a schematic illustration of a portion of a memory array according to an embodiment of the disclosure.

FIG. 3 is a diagram illustrating a portion of an array 300 of memory cells. The array 300 may be used to implement the memory array 160 of FIG. 1 in some embodiments. In the example illustrated in FIG. 3, the array 300 is configured in a cross-point memory array architecture, e.g., a three-dimensional (3D) cross-point memory array architecture. The multi-deck cross-point memory array 300 includes a number of successive memory cells, e.g., 205, 215, 225 disposed between alternating, e.g., interleaved, decks of word lines, e.g., 230-0, 230-1, . . . , 230-N and 212-0, 212-1, . . . , 212-N extending in a first direction and bit lines, e.g., 220-0, 220-1, . . . , 220-M and 214-0, 214-1, . . . , 214-M extending in a second direction. The number of decks can be expanded in number or can be reduced in number, for example. Each of the memory cells 205, 225 can be configured between word lines, e.g., 230-0, 230-1, . . . , 230-N and 212-0, 212-1, . . . , 212-N and bit lines, e.g., 220-0, 220-1, . . . , 220-M and 214-0, 214-1, . . . , 214-M, such that a single memory cell 205, 225 is directly electrically coupled with and is electrically in series with its respective bit line and word line. For example, array 300 can include a three-dimensional matrix of individually-addressable, e.g., randomly accessible, memory cells that can be accessed for data operations, e.g., sense and write, at a granularity as small as a single storage element or multiple storage elements. In a number of embodiments, memory array 300 can include more or less decks, bit lines, word lines, and/or memory cells than shown in the examples in FIG. 3.

Figure 4:
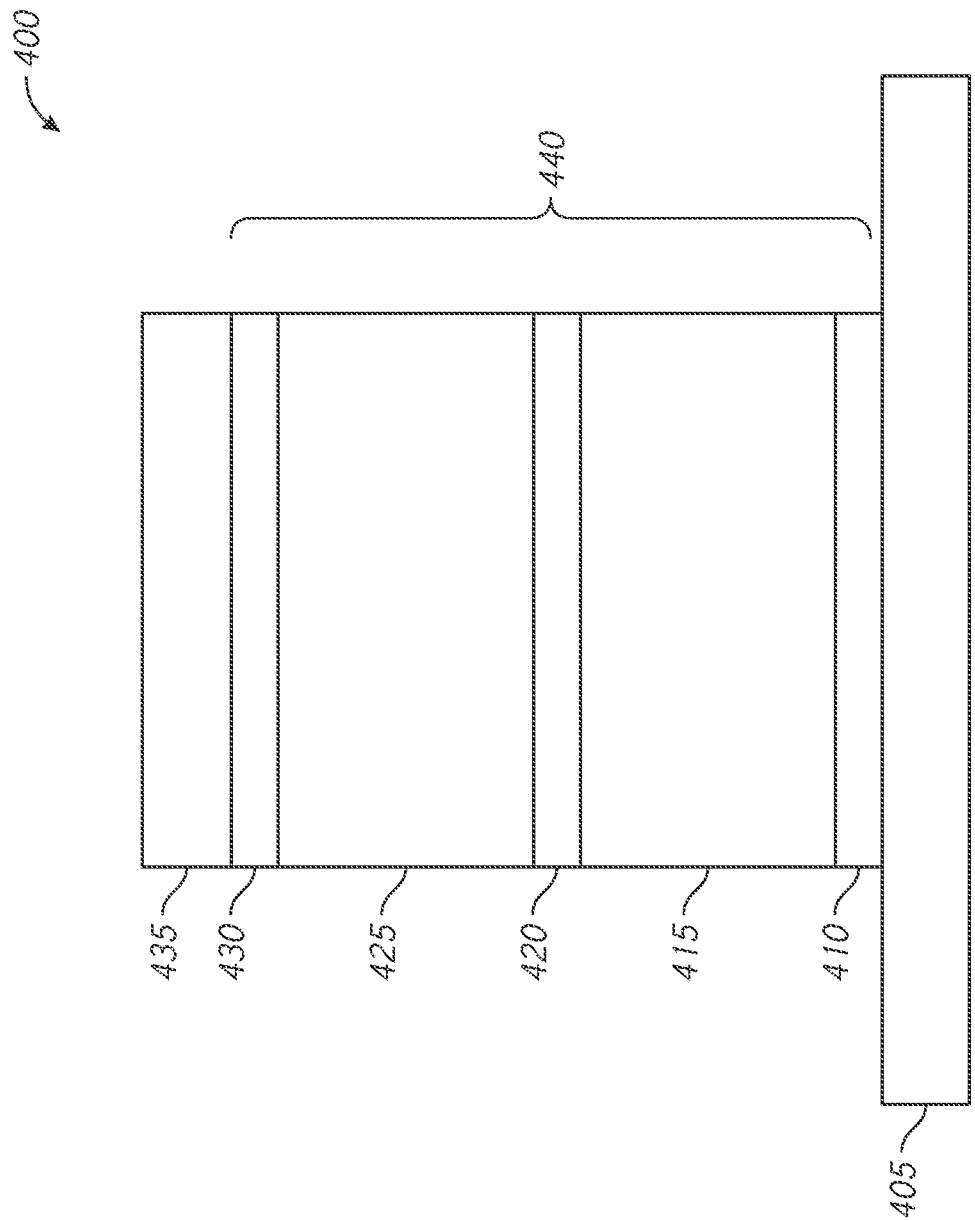
FIG. 4 is an illustration of a portion of a memory array according to an embodiment of the disclosure.

FIG. 4 is an illustration of a portion of a memory array 400 according to an embodiment of the disclosure. The portion of the memory array 400 may be included in the memory array 160 of FIG. 1. The memory array 400 may include a first access line 405 and a second access line 435. For ease of reference, the first access line may also be referred to as a word line (WL) 405 and the second access line may also be referred to as a bit line (BL) 435. As shown in FIG. 4, the WL 405 extends parallel to the plane of the page, and the BL 435 extends into the plane of the page, perpendicular to the WL 405. A memory cell 440 may be located at the intersection of the WL 405 and BL 435. The memory cell 440 may include a selector device 415. The selector device 415 may be coupled to WL 405 by a first electrode 410 and coupled to a second electrode 420. The electrode 420 may couple the selector device 415 to a memory element 425 included in the memory cell 440. The memory element 425 may be coupled to BL 435 by a third electrode 430. The memory element 425 may include a chalcogenide material. In some embodiments, the chalcogenide material may be a phase change material, but other materials may be used. In some embodiments, the selector device 415 may also include a chalcogenide material. In some embodiments, the selector device 415 may include a material that does not undergo a phase change during operation. In some embodiments, the memory element 425 and/or selector device 415 may include a ternary composition that may include selenium (Se), arsenic (As), germanium (Ge), and combinations thereof. In some embodiments, the memory element 425 and/or selector device 415 may include a quaternary composition that may include silicon (Si), Se, As, Ge, and combinations thereof. Other materials may also be used.

As will be described in more detail below, voltages and/or currents may be provided to the memory cell 440 using the first and second access lines WL 405 and BL 435. The first and second access lines WL 405 and BL 435 may also be used to sense a voltage and/or current of the memory cell 440, as well. Voltages and/or currents may be provided to the memory cell 440 to write data to the memory cell, and voltages and/or currents may be sensed to read data from the memory cell 440. Circuits, such as access line drivers may be coupled to the access lines WL 405 and BL 435 to provide the voltages to the memory cell 440, and a sense amplifier may be coupled to the access lines WL 405 and/or BL 435 to sense a voltage and/or current of the memory cell 440. Based on the voltage and/or current that is sensed, a logic value or logic values stored by the memory cell 440 may be determined.

The memory element 425 may be written to store one of at least two different logic states (e.g., '1,' '0') by a write operation. In some embodiments, the different logic states may be represented by different threshold voltages ($V_{TH}$) of the memory element 425. For example, a '1' logic state may be represented by a first $V_{TH}$ and a '0' logic state may be represented by a second $V_{TH}$. The threshold voltage the memory element 425 exhibits may be based on a state of a phase change material (PCM) included in the memory element 425 (e.g., amorphous or crystalline). The state of the PCM may be based on the magnitude of a current of a write pulse applied to the memory cell 440 during a write operation. In some embodiments, the magnitude of the voltage may be used to adjust the magnitude of the current of the write pulse. The state of the memory element 425 may be determined by applying a read pulse during a read operation. The write pulse and read pulse may be applied to the memory cell 440 using the first and second access lines 405 and 435.

The selector device 415 may be written to store one of least two different logic states (e.g., '1,' '0') by a write operation. In some embodiments, the different logic states may be represented by different threshold voltages ($V_{TH}$) of the selector device 415. For example, a '1' logic state may be represented by a first $V_{TH}$ and a '0' logic state may be represented by a second $V_{TH}$. The threshold voltage the selector device 415 exhibits may be based on a polarity of a write pulse applied to the memory cell 440 during a write operation and a polarity of a read pulse applied to the memory cell 440 during a read operation. The write pulse and read pulse may be applied to the memory cell 440 using the first and second access lines 405 and 435.

The memory cell 440 may be configured as a two-terminal device between the BL 435 and WL 405 in some embodiments. A first logic state may be written to the memory cell 440 by applying a voltage (e.g., a write pulse) across the memory cell 440 in a first polarity at a first voltage. A second logic state may be written to the memory cell 440 by applying a voltage (e.g., a write pulse) across the memory cell 440 in the first polarity at a second voltage. A third logic state may be written to the memory cell 440 by applying a voltage (e.g., a write pulse) across the memory cell 440 in a second polarity, which may be opposite to the first polarity, at a third voltage. A fourth logic state may be written to the memory cell 440 by applying a voltage (e.g., a write pulse) across the memory cell 440 in the second polarity at a fourth voltage. In some embodiments, the first and third voltages may be the same magnitude. In some embodiments, the second and fourth voltages may be the same magnitude.

The memory cell 440 may be read by applying a voltage (e.g., a read pulse) across the memory cell 440 (e.g., using BL 435 and WL 405). In some embodiments, the memory cell 440 is read by applying a voltage across the memory cell 440 in the first polarity. In other embodiments, the memory cell 440 is read by applying a voltage across the memory cell 440 in the second polarity. The memory cell 440 may always be read with the same polarity. When the memory cell 440 is read with a voltage in the same voltage polarity with which the memory cell 440 was written, the selector device 415 may exhibit a first $V_{TH}$. When the memory cell 440 is read with a voltage in the opposite voltage polarity with which the memory cell 440 was written, the selector device 415 may exhibit a second $V_{TH}$. In some embodiments, the memory element 425 may exhibit the same threshold voltage regardless of the polarity of the write and read pulses. In some embodiments, the threshold voltage of the memory element 425 may be based on the magnitude of the write pulse applied across the memory cell 440. The different threshold voltages of the memory cell 440, based on the threshold voltages of the memory element 425 and selector device 415, may be used to represent different logic states.

When the memory cell 440 is a two-terminal device, the relative values of the voltages between the terminals determines the magnitude and the polarity of the voltage applied across the memory cell 440. For example, providing a voltage of 3V to the BL 435 and 0V to WL 405 results in the same magnitude and polarity of voltage as providing a voltage of 6V at BL 435 and 3V at WL 405. Other non-negative (e.g., 0V or greater), negative, and/or positive voltages may be provided to the memory access lines in some embodiments. As used herein, forward polarity indicates that the BL 435 is set at a higher voltage than the WL 405 and reverse polarity indicates that the BL 435 is set at a lower voltage than the WL 405. However, the use of "forward" and "reverse" polarities is by way of example, and the embodiments of the invention are not limited to those of the particular polarity directions described herein.

Figure 5:
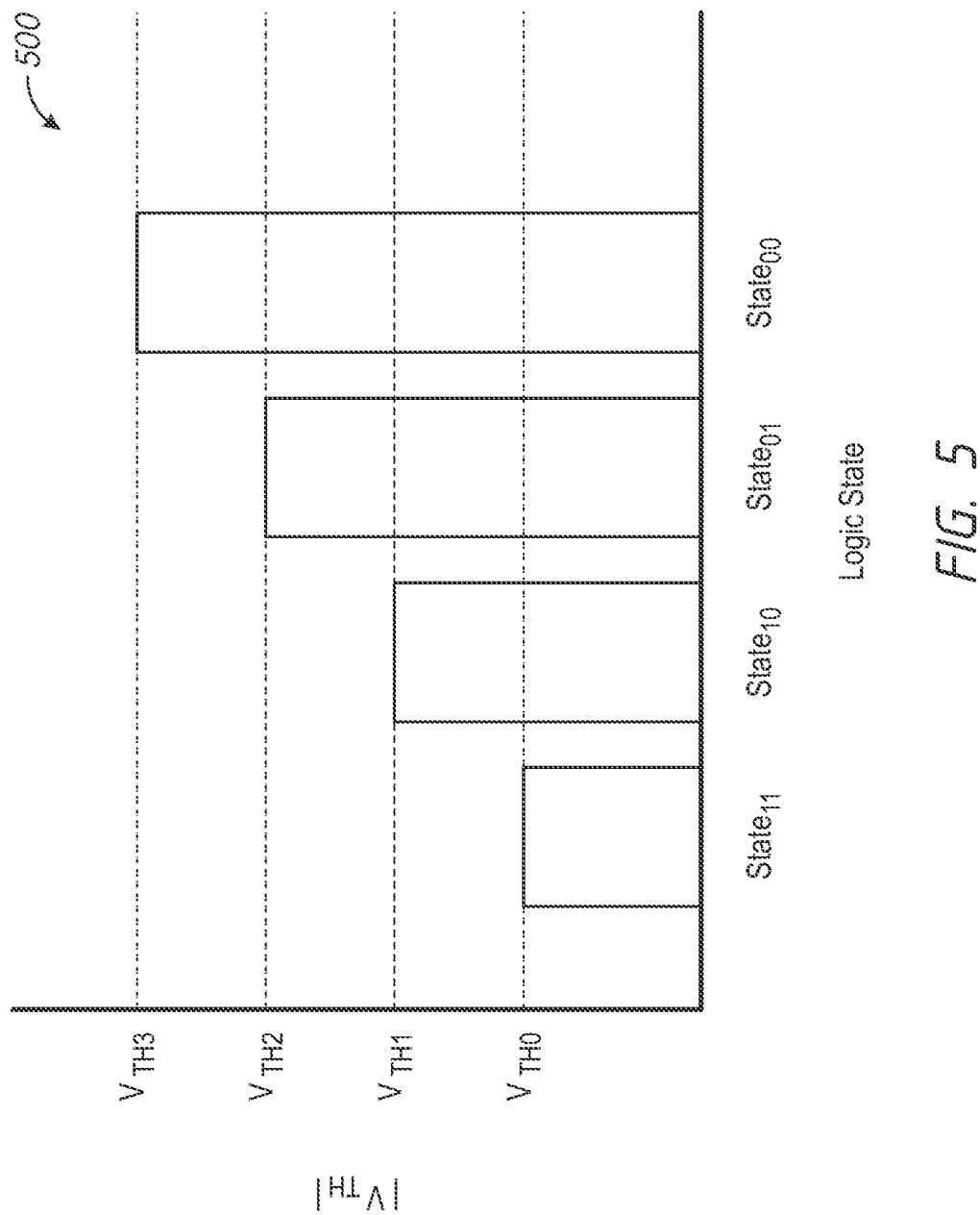
FIG. 5 is a voltage plot of threshold voltages according to an embodiment of the disclosure.

FIG. 5 is a voltage plot 500 of threshold voltages for logic states of a memory cell according to an embodiment of the disclosure. In the embodiment shown in FIG. 5, a memory element of the memory cell may be programmed into one of two logic states and a selector device of the memory cell may be programmed into one of two logic states to store two bits of data in the memory cell, which may correspond to a total of four logic states for the memory cell. For purposes of explaining the principles of the disclosure, the application will describe a four logic state memory cell. However, a memory cell having two, three, six, eight, or other number of logic states may be used.

The threshold voltages of the memory cell are the threshold voltages observed when the memory cell is read. The memory cell may be read using a read voltage in the same polarity each time it is read, for example, in forward polarity. $V_{TH0}$ may be observed in the memory cell when the memory cell was written to at a low voltage in the same polarity as the read voltage. This may correspond to logic $State_{11}$. By low voltage, it is meant a voltage appropriate to program a PCM memory element to a set state. For example, the memory cell may have been written to in a forward polarity at a low voltage and is then read in forward polarity. In some embodiments, multiple low voltage magnitudes may be used to read or write to the memory cell. For example, a first low voltage magnitude may be used to write the memory cell in a first polarity and a second low voltage magnitude may be used to write the memory cell in a second polarity in some embodiments.

Conversely, $V_{TH1}$ may be observed in the memory cell when the memory cell was written to at the low voltage in the opposite polarity as the read voltage. This may correspond to logic $State_{10}$. For example, the memory cell may have been written to at a low voltage in a reverse polarity and is then read in a forward polarity. In some embodiments, multiple high voltage magnitudes may be used to read or write to the memory cell. For example, a first high voltage magnitude may be used to write the memory cell in a first polarity and a second high voltage magnitude may be used to write the memory cell in a second polarity in some embodiments.

$V_{TH2}$ may be observed in the memory cell when the memory cell was written to at a high voltage in the same polarity as the read voltage. This may correspond to logic $State_{01}$. By high voltage, it is meant a voltage appropriate to program a PCM memory element to a reset state. For example, the memory cell may have been written to in a forward polarity at a high voltage and is then read in forward polarity.

Finally, $V_{TH3}$ may be observed in the memory cell when the memory cell was written to at the high voltage in the opposite polarity as the read voltage. This may correspond to logic $State_{00}$. For example, the memory cell may have been written to at a high voltage in a reverse polarity and is then read in a forward polarity.

As illustrated by FIG. 5, in some embodiments, different threshold voltages may be observed for the memory cell written and read in opposite polarities in comparison to the memory cell written and read in the same polarity. These different threshold voltages may be observed even when the same or similar magnitude voltage write pulse is used. In summary, in the embodiment illustrated in FIG. 5, $State_{11}$ is written by applying a low voltage in a first polarity. $State_{10}$ is written by applying the low voltage in a second polarity. $State_{01}$ is written by applying a high voltage in the first polarity, and $State_{00}$ is written by applying the high voltage in the second polarity. It is understood that different assignments of the logic states to the different threshold voltages may be used. For example, the threshold voltages assigned to $State_{01}$ and $State_{10}$ may be reversed. The magnitudes of the threshold voltages and/or differences between the threshold voltages exhibited by the memory cell may be based, at least in part, on the materials included in the memory element and/or selector device. The number of possible logic states of the memory cell may be based, at least in part, on the materials included in the memory element and/or selector device. The physical geometry of the memory element and/or selector device may affect the threshold voltage levels and/or the number of possible logic states of the memory cell.

Figure 6:
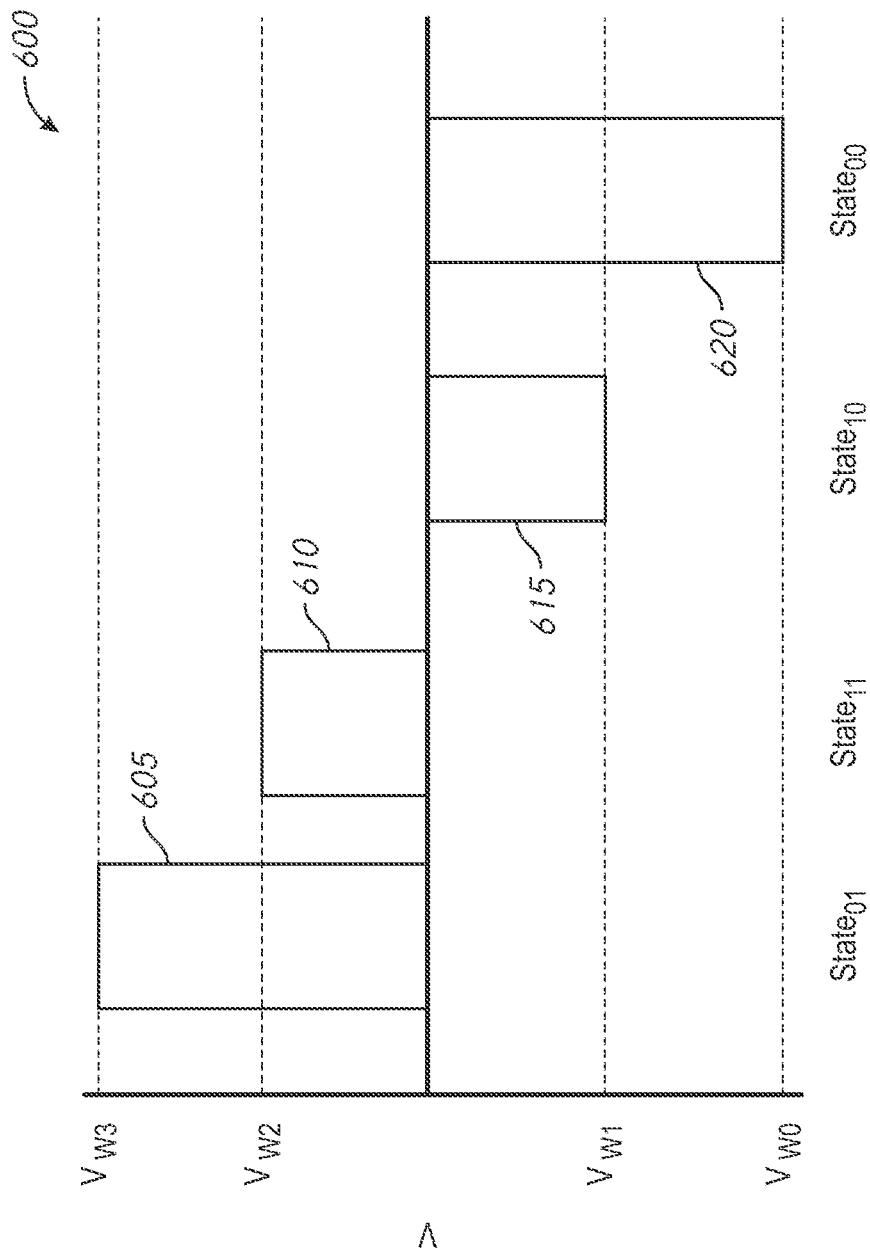
FIG. 6 is a voltage plot of write pulse voltages according to an embodiment of the disclosure.

FIG. 6 is a voltage plot 600 of four exemplary write pulses 605, 610, 615, 620 according to an embodiment of the disclosure. The write pulses 605, 610, 615, 620 may be used to write a logic state to a memory cell, such as memory cell 440 shown in FIG. 4, during a write operation. The write pulses may be applied by providing a first voltage to the BL and providing a second voltage to the WL. Circuits coupled to access lines to which memory cells may be coupled may be used to provide the first voltage, for example, access line drivers included in the decoder circuits 140 and 150 of FIG. 1. The circuits may be controlled by the internal control signals provided by a control logic, for example, control logic 110 of FIG. 1. The resulting voltage applied to the memory cell is the difference between the first and second voltages. The write pulses may be the same duration as read pulses in some embodiments. In some embodiments the duration is 10 ns-50 ns. In some embodiments, the duration is 1-100 ns. In some embodiments, the duration is 1 ns-1 μs. Writing to the memory cell may take the same time as reading the memory cell in some embodiments. Although shown as square pulses in FIG. 6, write pulses of other shapes may be implemented. Other suitable write pulse shapes include, but are not limited to, triangular, trapezoidal, and/or sinusoidal. In some embodiments, write pulses may include leading and/or trailing edges.

The polarity of the write pulses may be either a first polarity or a second polarity (e.g., forward or reverse). Write pulse 605 may apply a voltage $V_{W3}$ to a memory cell in a first polarity (e.g., bit line at 6V and word line at 0V). The polarity of the write pulse 605 may be the same as the polarity of read pulses (not shown in FIG. 6). This may write logic state $State_{01}$ to the memory cell shown in FIG. 5. As shown in FIG. 5, when write pulse 605 writes $State_{01}$ to the memory cell, the memory cell exhibits threshold voltage $V_{TH2}$ when read.

Write pulse 610 may apply a voltage $V_{W2}$ to a memory cell in the first polarity (e.g., bit line at 4V and word line at 0V). The polarity of the write pulse 610 may be the same as the polarity of read pulses (not shown in FIG. 6). This may write logic state $State_{11}$ to the memory cell shown in FIG. 5. As shown in FIG. 5, when write pulse 610 writes Staten to the memory cell, the memory cell exhibits threshold voltage $V_{TH0}$ when read.

Write pulse 615 may apply a voltage $V_{W1}$ to the memory cell in a second polarity (e.g., bit line at −4V and word line at 0V or bit line at 0V and word line at 4V). Write pulse 615 may have the opposite polarity of write pulses 605, 610 and read pulses (not shown in FIG. 6). Write pulse 615 may write logic state $State_{10}$ to the memory cell. As shown in FIG. 5, when write pulse 615 writes $State_{10}$ to the memory cell, the memory cell exhibits threshold voltage $V_{TH1}$ when read.

Write pulse 620 may apply a voltage $V_{W0}$ to the memory cell in the second polarity (e.g., bit line at −6V and word line at 0V or bit line at 0V and word line at 6V). Write pulse 620 may have the opposite polarity of write pulses 605, 610 and read pulses (not shown in FIG. 6). Write pulse 620 may write logic state State$_{00}$ to the memory cell. As shown in FIG. 5, when write pulse 620 writes State$_{00}$ to the memory cell, the memory cell exhibits threshold voltage V$_{TH3}$ when read.

In some embodiments V$_{W0}$ and V$_{W3}$ may have the same voltage magnitude. In some embodiments, V$_{W0}$ and V$_{W3}$ may have different magnitudes. The magnitudes of V$_{W0}$ and V$_{W3}$ may be selected to completely melt a PCM or melt at least a portion of a PCM included in a memory element of a memory cell. In some embodiments V$_{W1}$ and V$_{W2}$ may have the same voltage magnitude. In some embodiments, V$_{W1}$ and V$_{W2}$ may have different magnitudes. The magnitudes of V$_{W1}$ and V$_{W2}$ may be selected to crystallize a PCM included in a memory element of a memory cell.

In some embodiments, two or more states, which may correspond to two or more different threshold voltages, may be associated with a same logic state of the memory cell. For example, a memory cell may have three logic states: State$_A$, State$_B$, and State$_C$. In this example, State$_{10}$ and State$_{01}$ shown in FIG. 5 may correspond to a same logic state (e.g., State$_B$) and both write pulses 610 and 615 shown in FIG. 6 may be used to write State$_B$ to the memory cell. Other combinations of logic states may be used. In some embodiments, a memory cell with three logic states may correspond to a 1.5 bit memory cell. Two or more logic states, having different threshold voltages, corresponding to the same state may be desirable in some embodiments to provide sufficient differences between threshold voltages of different logic states. For example, when V$_{TH1}$ and V$_{TH2}$, as shown in FIG. 5, are similar values, it may be desirable for V$_{TH1}$ and V$_{TH2}$ to correspond to the same logic state.

Although the write pulses shown in FIG. 6 are plotted and described with respect to voltage, the write pulses could be plotted and described with respect to current and be within the scope of the present disclosure. Voltage and current are proportional, and absent other factors, increasing or decreasing the current of a write pulse may have a similar effect on the operation of a memory device as increasing or decreasing the voltage of a write pulse in some embodiments.

Figure 7A:
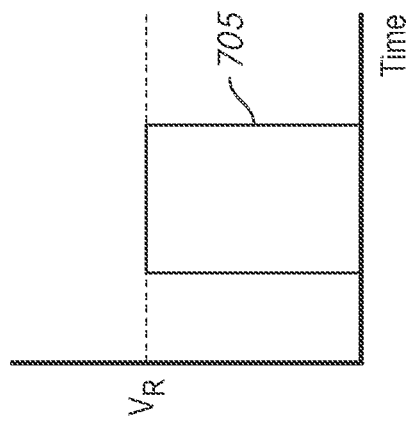
FIGS. 7A-7C are voltage plots of read pulse voltages according to embodiments of the disclosure.
Figure 7B:
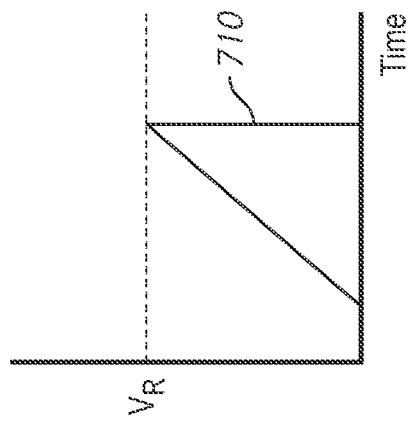
Figure 7C:
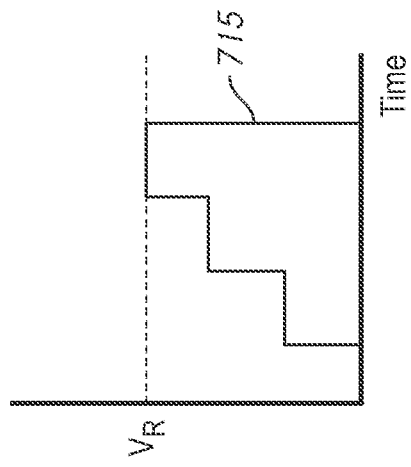

FIGS. 7A-7C are voltage plots of exemplary read pulses 705, 710, 715, respectively, according to embodiments of the disclosure. Circuits coupled to access lines to which memory cells may be coupled may be used to provide the read pulses, for example, access line drivers included in the decoder circuits 140 and 150 of FIG. 1. The circuits may be controlled by the internal control signals provided by a control logic, for example, control logic 110 of FIG. 1. A read pulse may be a voltage V$_R$ applied to the memory cell for a period of time (e.g., 10 ns-50 ns, 1 ns-100 ns, 1 ns-1 µs). In some embodiments, the read pulse may be a square pulse 705 as shown in FIG. 7A. In some embodiments, as shown in FIG. 7B, the read pulse may be a ramp 710, that is, a linearly increasing voltage may be applied across the memory cell. In some embodiments, the read pulse may be a staircase 715 as shown in FIG. 7C, where two or more discrete voltages increasing in magnitude are applied across the memory cell at different periods of time. Read pulses of other shapes may be implemented. Other suitable read pulse shapes include, but are not limited to, triangular, trapezoidal, and/or sinusoidal. In some embodiments, read pulses may include leading and/or trailing edges. Although read pulses 705, 710, 715 are all shown as having forward polarity, the read pulses 705, 710, 715 may be implemented in reverse polarity. In some embodiments, the read pulses may always be applied with the same polarity (e.g., all read pulses exhibit forward polarity, all read pulses exhibit reverse polarity).

In some embodiments, the memory cell may be implemented using the memory cell 440 illustrated in FIG. 4. The read pulse may be applied by providing a first voltage to a bit line (e.g., BL 435) and providing a second voltage to a corresponding word line (e.g., WL 405). A sense amplifier (not shown) coupled to a bit line associated with the memory cell to be read may be used to detect a current through the memory cell. The sense amplifier may be configured to sense the current through the memory cell responsive to the read operation and provide an output signal indicative of the logic state stored by the memory cell. The sense amplifier may be included in a memory that includes the memory cell. For example, the sense amplifier may be included with other read and write circuits, decoding circuits, register circuits, etc. of the memory that may be coupled to a memory array. When a read pulse is applied to a memory cell, the memory cell conducts current when the read pulse exceeds the threshold voltage of the memory cell. The sense amplifier may detect a current I$_S$ through the memory cell. When a read pulse below the threshold voltage is applied to a memory cell, the memory cell does not conduct current. The sense amplifier may detect little or no current through the memory cell. In some embodiments, a threshold current I$_{TH}$ may be defined for sensing the logic state stored by the memory cell. The threshold current I$_{TH}$ may be set above a current that may pass through the memory cell when the memory cell does not threshold in response to the read pulse, but equal to or below an expected current through the memory cell when the memory cell does threshold in response to the read pulse. That is, the threshold current I$_{TH}$ should be higher than a leakage current of the bit line and/or word line. When sense amplifier detects I$_s \geq$ I$_{TH}$, a logic state may be read from the memory cell. Other methods of detecting a current and/or a voltage across the memory cell may be used.

The threshold event may be used to determine the logic state of the memory cell in some embodiments. For example, using the ramp read pulse 710 shown in FIG. 7B, a threshold event (e.g., I$_s \geq$ I$_{TH}$), may be detected when the read pulse 710 is at a voltage (V). V may be less than or equal to V$_R$. Based, at least in part, on the value of V when the threshold event is detected, the logic state of the memory cell may be determined. Continuing this example, if V$_R$=6V, V$_{TH0}$=4V, V$_{TH1}$=4.5V, V$_{TH2}$=5.0V, and V$_{TH3}$=5.5V. If V is equal to 5.0V or slightly greater than 5.0V when a threshold event is detected, it may be determined that the memory cell is in State$_{01}$ as shown in FIG. 5. Similarly, if the read pulse is a staircase such as read pulse 715 in FIG. 7C, the voltage V of the step of the staircase when a threshold event is detected may be used to determine a logic state of the memory cell.

In some embodiments, a time from when the read pulse is applied to when the threshold event is detected (e.g., detecting a voltage or current across the memory cell) may be used to determine the logic state of the memory cell. For example, if a time to threshold a memory cell at a voltage may be known and/or a time to reach a voltage for a read pulse (e.g., a read pulse with a voltage ramp) may be known. Returning to the example of a voltage ramp read pulse, such as read pulse 710 shown in FIG. 7B, it may be known that the voltage ramp is between 0-4.1V at 0-10 ns, 4.2-4.6V at 11-15 ns, 4.7-5.1V at 16-20 ns, and 5.2-6V at 21-30 ns. If a threshold event is detected at 8 ns, the memory cell may be determined to have a V$_{TH}$=4V and the logic state of the memory cell may be determined to be State_N. The examples provided are for explanatory purposes and should not be interpreted to limit the disclosure to the examples given.

Although the read pulses shown in FIGS. 7A-C are plotted and described with respect to voltage, the read pulses could be plotted and described with respect to current and be within the scope of the present disclosure. Voltage and current are proportional, and absent other factors, increasing or decreasing the current of a read pulse may have a similar effect on the operation of a memory device as increasing or decreasing the voltage of a write pulse in some embodiments.

A variety of writing and reading protocols may be used with a memory cell having the threshold voltage properties as described in reference to FIGS. 5-7.

Figure 8:
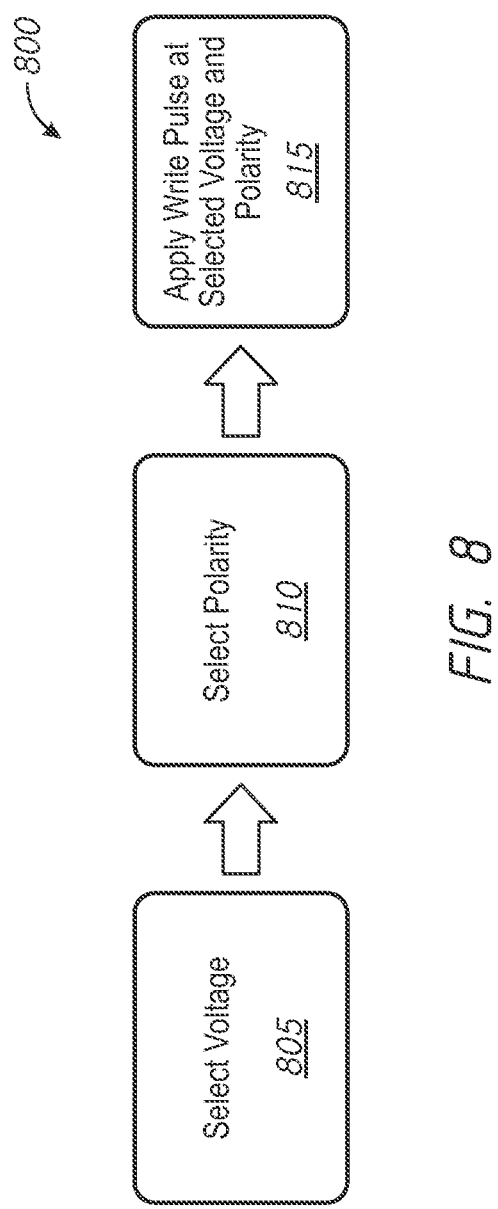
FIG. 8 is a flow chart of a method according to an embodiment of the disclosure.

FIG. 8 is a flow chart of a method 800 for writing a memory cell according to an embodiment of the disclosure. In some embodiments, the method 800 may be used by the memory 100 of FIG. 1 for writing logic states, which may correspond to bits in some embodiments, to a memory cell, and the memory cell may be implemented by memory cell 440 shown in FIG. 4. For example, the control logic 110 may provide internal control signals to various circuits in the memory 100 to perform the method 800. The memory cell may exhibit the threshold voltage characteristics illustrated in FIGS. 5-7. In some embodiments, a first bit may be stored in the memory element 425, and a second bit may be stored in the selector device 415. At Step 805, a voltage is selected for a write pulse. A voltage magnitude of a write pulse may be selected based on a first bit to be written to the memory element 425. For example, a high magnitude may be selected to write '0' and a low magnitude may be selected to write '1' to the memory element 425. At Step 810, a polarity is selected for the write pulse. A polarity of the write pulse may be selected based on a second bit to be written to the selector device 415. For example, a forward polarity may be selected to write '1' and a reverse polarity may be selected to write '0' to the selector device 415. At Step 815, the write pulse at the selected voltage and polarity is applied. The write pulse at the selected voltage magnitude and polarity may be applied across the memory cell 440. In some embodiments, the write pulse may be applied by charging WL 405 and BL 435 to appropriate voltages. After the write pulse is applied, the memory cell 440 may exhibit a threshold voltage corresponding to the values of the first and second bits. For example, the memory cell 440 may exhibit one of the threshold voltages shown in FIG. 5.

In some embodiments, Steps 805 and 810 may be performed in reverse order. In some embodiments, Steps 805 and 810 may be performed simultaneously. In some embodiments, the locations of the first and second bits may be reversed. That is, the first bit may be written to the selector device 415 and the second bit may be written to the memory element 425. In some embodiments, multiple bits, for example, more than two logic states, may be stored in the memory element 425.

Method 800 may be used for writing to memory cells having other numbers of bits and/or logic levels. In some embodiments, certain combinations of voltage magnitude and/or polarity selections may be combined into same logic states. For example, for a three level memory cell, after Step 815, the memory cell 440 may exhibit threshold voltages corresponding to only three logic states. In this example, for a certain voltage magnitude selected at Step 805, the same logic state may be written to the memory cell 440 regardless of what polarity is selected at Step 810. Other combinations of voltage magnitude and polarity may be used.

Figure 9:
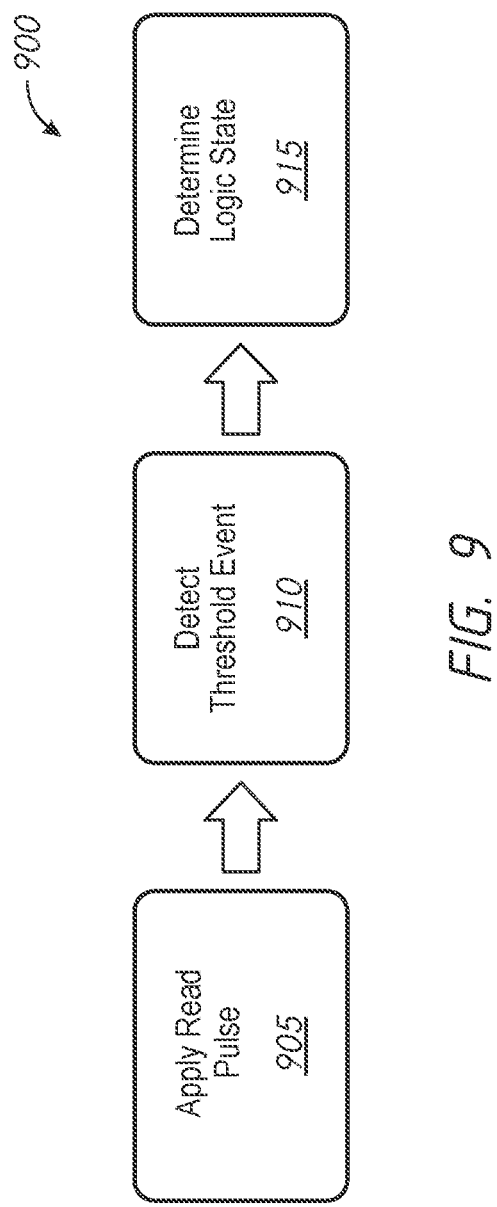
FIG. 9 is a flow chart of a method according to an embodiment of the disclosure.

FIG. 9 is a flow chart of a method 900 for reading a memory cell according to an embodiment of the disclosure. In some embodiments, the method 900 may be used by the memory 100 of FIG. 1 for writing a memory cell, and the memory cell may be implemented by memory cell 440 shown in FIG. 4. For example, the control logic 110 may provide internal control signals to various circuits in the memory 100 to perform the method 900. The memory cell may exhibit the threshold voltage characteristics illustrated in FIGS. 5-7. The method 900 may utilize a ramped voltage read pulse, for example, read pulse 710 shown in FIG. 7B. The read pulse may apply an increasing voltage level up to a maximum voltage of $V_R$. The read pulse may be the same polarity each time a read operation is performed by a memory. The maximum voltage $V_R$ of the read pulse may be selected to be greater than the threshold voltage for one or more of the logic states of the memory cell 440. In some embodiments, the maximum voltage of the read pulses may be high enough to threshold a memory cell in any logic state. For example, in some embodiments $V_R$=6V, $V_{TH0}$=4V, $V_{TH1}$=4.5V, $V_{TH2}$=5.0V, and $V_{TH3}$=5.5V. In some embodiments, $V_R$ may be chosen to fall between $V_{TH2}$ and $V_{TH3}$, for example, $V_R$=5.25V. Other maximum voltages of the read pulse and other threshold voltage distributions of the memory cell may be used.

At Step 905, a read pulse is applied to the memory cell. The polarity of the read pulse may be a same or different polarity than a write pulse applied to the memory cell. The voltage of the read pulse may be ramped linearly as shown in FIG. 7B or non-linearly (e.g., exponentially). In some embodiments, the voltage is increased to a maximum voltage $V_R$. In some embodiments, the voltage is increased until a threshold event is detected in the memory cell.

At Step 910, a threshold event of the memory cell is detected. The threshold may be detected by a sense amplifier in some embodiments. In some embodiments, a voltage and/or current may be detected in response to the read pulse and/or threshold event. In some embodiments, at Step 910, no threshold event of the memory cell is detected. In these embodiments, $V_R$ may have been selected to below the highest threshold voltage of the memory cell (e.g., $V_R$=6.0V and $V_{TH3}$=6.5V).

The logic state of the memory cell is determined at Step 915. In some embodiments, the logic state of the memory cell may be one of a plurality of logic states. In some embodiments, the logic state of the memory cell is determined by the voltage required to threshold the memory cell. In embodiments where no threshold event is detected at Step 910, it may be determined that the memory cell is in the logic state having the highest threshold voltage. In some embodiments, the time required to threshold the memory cell may be used to determine the logic state of the memory cell. For example, if a memory cell thresholds between 2-4 ns, it may be determined to have been in State_N and if the memory cell thresholds between 8-10 ns, it may be determined to have been in State_00. Other time distributions may be possible. In some embodiments, using the time required to threshold may be used with a voltage ramp pulse such as read pulse 710 in FIG. 7B.

The method 900 for reading a memory cell may be destructive. That is, the application of the read pulse may change the threshold voltage of the memory cell, and thus, change the logic state of the memory cell. Consequently, the logic state of the memory cell may need to be rewritten after the memory cell is read. The logic state of the memory cell may be rewritten following Step 915. A write operation, such as method 800 may be used to rewrite the logic state to the memory cell.

Figure 10:
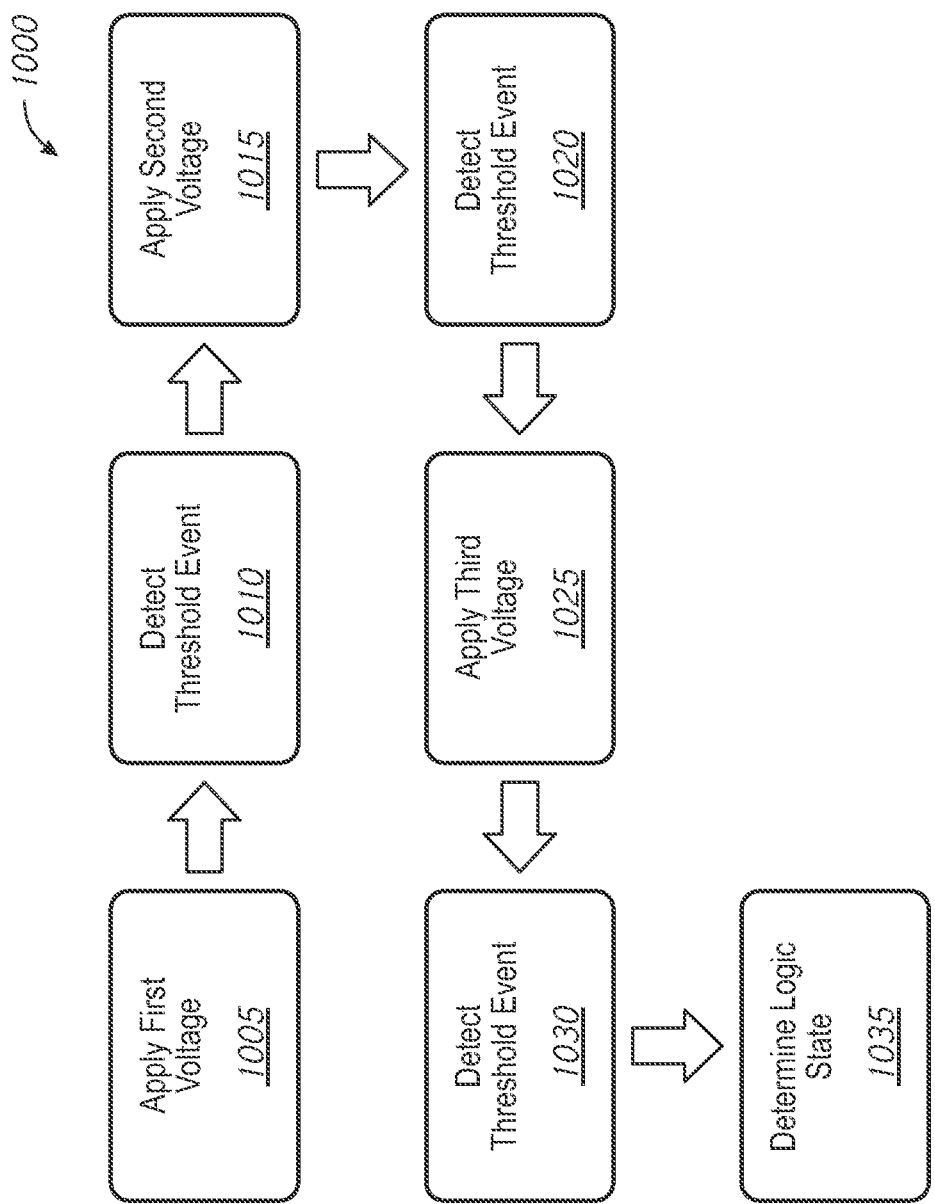
FIG. 10 is a flow chart of a method according to an embodiment of the disclosure.

FIG. 10 is a flow chart of a method 1000 for reading a memory cell according to an embodiment of the disclosure. In some embodiments, the method 1000 may be used by the memory 100 of FIG. 1 for reading a memory cell, and the memory cell may be implemented by memory cell 440 shown in FIG. 4. The memory cell may exhibit the threshold voltage characteristics illustrated in FIGS. 5-7. The method 1000 may utilize a staircase voltage read pulse, for example, read pulse 715 shown in FIG. 7C.

At Step 1005, a first voltage (e.g., 4V) is applied across the memory cell. At Step 1010, a threshold event may be detected. If a threshold event is detected, a first logic state (e.g., State$_{11}$) may be determined at Step 1035, and the other steps shown in method 1000 may be omitted.

If no threshold event is detected at Step 1010, a second voltage (e.g., 4.5V), greater than the first voltage, may be applied across the memory cell at Step 1015. At Step 1020, a threshold event may be detected. If a threshold event is detected, a second logic state (e.g., State$_{10}$) may be determined at Step 1035, and the other steps shown in method 1000 may be omitted.

If no threshold event is detected at Step 1010, a third voltage (e.g., 5V), greater than the first and second voltages, may be applied across the memory cell at Step 1025. At Step 1030, a threshold event may be detected. If a threshold event is detected, a third logic state (e.g., State$_{01}$) may be determined at Step 1035. If no threshold event is detected, a fourth logic state (e.g., State$_{00}$) may be determined at Step 1035.

In some embodiments, even if a threshold event is detected at Step 1010 and/or Step 1020, additional voltages of the staircase voltage read pulse may be applied to the memory cell. That is, the additional steps are not omitted from method 1000. In some embodiments, the staircase voltage read pulse may include more or less than three voltages. The number of voltages included in the read pulse may be determined, at least in part, on the possible number of logic states of the memory cell. For example, in a memory cell having three logic levels (e.g., States$_{A-C}$), which may correspond to 1.5 bits, the staircase voltage read pulse may include two voltages and Steps 1025 and 1030 may be omitted from method 1000.

The method 1000 for reading a memory cell may be destructive. That is, the application of the read pulse may change the threshold voltage of the memory cell, and thus, change the logic state of the memory cell. Consequently, the logic state of the memory cell may need to be rewritten after the memory cell is read. The logic state of the memory cell may be rewritten following Step 1035. A write operation, such as method 800 may be used to rewrite the logic state to the memory cell.

Other writing and reading protocols and/or modifications to the protocols described herein may be used without departing from the principles of the disclosure. For example, in some methods, sensing currents and/or voltages may be limited to a specific time period. The time period may be from the initiation of a read pulse to a point in time after the initiation of the read pulse (e.g., 20 ns). In some embodiments, a memory cell may be read in a forward polarity and written in either the forward or reverse polarity. In some embodiments, the memory cell may be read in a reverse polarity and written in either the forward or reverse polarity.

In some embodiments, the materials of the memory element and/or selector device of the memory cell may exhibit a greater difference between threshold voltages of several logic states when read in a reverse polarity. In some embodiments, the materials of the memory element and/or selector device of the memory cell may exhibit a greater difference between threshold voltages of the several logic states when read in a forward polarity. The polarity of the read pulses may be selected to provide the greatest difference between threshold voltages.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method, comprising:
   selecting a voltage of a write pulse;
   selecting a polarity of the write pulse; and
   applying the write pulse having the voltage and polarity across a memory cell, wherein the write pulse writes a logic state to the memory cell, wherein the logic state is based, at least in part, on the voltage and polarity of the write pulse, wherein the logic state of the memory cell corresponds to multiple bits, wherein the multiple bits of data are stored in different physical locations in the memory cell, wherein a first bit of the multiple bits is stored in a selector device of the memory cell and a second bit of the multiple bits is stored in a memory element of the memory cell.

2. The method of claim 1, wherein selecting the voltage corresponds to selecting a value of a first bit to be written to the memory cell.

3. The method of claim 1, wherein selecting the polarity corresponds to selecting a value of a second bit to be written to the memory cell.

4. The method of claim 1, wherein the voltage is one of two voltages and the polarity is one of two polarities, and the logic state is one of four logic states.

5. The method of claim 1, wherein the logic state is one of a plurality of logic states, wherein the plurality includes at least three logic states.

6. A method comprising:
   selecting a magnitude of a write pulse;
   selecting a polarity of the write pulse; and
   applying the write pulse having the magnitude and polarity across a memory cell, wherein the write pulse writes a plurality of bits to the memory cell, wherein a first bit of the plurality of bits is stored in a selector device of the memory cell and a second bit of the plurality of bits is stored in a memory element of the memory cell.

7. The method of claim 6, wherein the first bit is based, at least in part, on the polarity of the write pulse.

8. The method of claim 6, wherein the second bit is based, at least in part, on the magnitude of the write pulse.

9. The method of claim 6, wherein the magnitude comprises a voltage magnitude, a current magnitude, or a combination thereof.

10. The method of claim 6, wherein one of the plurality of bits is based on the magnitude of the write pulse and another one of the plurality of bits is based on the polarity of the write pulse.

11. The method of claim 6, wherein different combinations of the plurality of bits correspond to different threshold voltages of the memory cell.

12. A method comprising:
  receiving, at an I/O control circuit of a memory a plurality of bits to be written to a memory cell of a memory array; and
  applying, with a data I/O circuit of the memory, a write pulse having a magnitude and a polarity, to write the plurality of bits to the memory cell, wherein a first one of the plurality of bits is written to a first physical location of the memory cell and a second one of the plurality of bits is written to a second physical location of the memory cell, wherein the first physical location comprises a selector device of the memory cell and the second physical location comprises a memory element of the memory cell.

13. The method of claim 12, wherein a state of one of the plurality of bits is based on the magnitude of the write pulse.

14. The method of claim 12, wherein a state of one of the plurality of bits is based on the polarity of the write pulse.

15. The method of claim 12, further comprising:
  receiving at control logic of the memory, a write command, wherein applying the write pulse is performed responsive, at least in part, to the write command, and
  providing the plurality of bits from the I/O control circuit to the data I/O circuit via a data bus.

\* \* \* \* \*